US009478426B2

(12) United States Patent
Thomason et al.

(10) Patent No.: US 9,478,426 B2
(45) Date of Patent: Oct. 25, 2016

(54) SEMICONDUCTOR DEVICE AND MANUFACTURING METHOD THEREOF

(71) Applicant: Semiconductor Components Industries, LLC, Phoenix, AZ (US)

(72) Inventors: Michael Thomason, Blackfoot, ID (US); Mohammed Tanvir Quddus, Chandler, AZ (US); James Morgan, Chandler, AZ (US); Mihir Mudholkar, Tempe, AZ (US); Scott Donaldson, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/472,492

(22) Filed: Aug. 29, 2014

(65) Prior Publication Data

US 2015/0243557 A1   Aug. 27, 2015

Related U.S. Application Data

(60) Provisional application No. 61/945,771, filed on Feb. 27, 2014.

(51) Int. Cl.
*H01L 21/768* (2006.01)
*H01L 21/3213* (2006.01)
*H01L 21/285* (2006.01)
*H01L 21/324* (2006.01)

(Continued)

(52) U.S. Cl.
CPC ..... *H01L 21/2855* (2013.01); *H01L 21/28568* (2013.01); *H01L 21/324* (2013.01); *H01L 21/76883* (2013.01); *H01L 21/76889* (2013.01); *H01L 29/401* (2013.01); *H01L 29/475* (2013.01); *H01L 29/8725* (2013.01); *H01L 21/32134* (2013.01)

(58) Field of Classification Search
CPC .......... H01L 21/32051; H01L 21/32055; H01L 29/872; H01L 23/53209; H01L 2924/10827
USPC ........................................................ 438/396
See application file for complete search history.

(56) References Cited

U.S. PATENT DOCUMENTS 6,184,564 B1   2/2001   Gould
6,621,107 B2   9/2003   Blanchard et al.

(Continued)

FOREIGN PATENT DOCUMENTS

EP    0111364 B1      3/1989
WO    2010096261 A3   11/2010

OTHER PUBLICATIONS

Kent Walters, Bob Werner; Micro Notes Series 401; Introduction to Schottky Rectifiers; 2 pages (Continued)

*Primary Examiner* — Moazzam Hossain

(57) ABSTRACT

A number of variations may include a method that may include depositing a first layer on a first semiconductor epi layer (epitaxial layer) in an overlying position with respect to at least one trench structure formed in the first semiconductor epi layer. The layer may include a first metal and a second metal. The first semiconductor epi layer may be subjected to at least a first annealing act to provide a first structure. At least a portion of the first structure may be stripped to remove any of the first layer not reacted with silicon to form a silicide during the first annealing act. Thereafter, the stripped first structure may be subjected to a second annealing act.

20 Claims, 4 Drawing Sheets

(51) Int. Cl.
*H01L 29/40* (2006.01)
*H01L 29/47* (2006.01)
*H01L 29/872* (2006.01)

(56) References Cited

U.S. PATENT DOCUMENTS

| | | | |
|---|---|---|---|
| 6,800,897 B2 | 10/2004 | Baliga | |
| 6,846,729 B2 | 1/2005 | Andoh et al. | |
| 7,749,877 B2 | 7/2010 | Carta et al. | |
| 7,786,003 B1* | 8/2010 | Halliyal | H01L 21/28518 438/630 |
| 8,044,461 B2 | 10/2011 | Session | |
| 8,143,655 B2 | 3/2012 | Chiola | |
| 8,148,749 B2 | 4/2012 | Grebs et al. | |
| 8,168,466 B2 | 5/2012 | Quddus et al. | |
| 8,664,065 B2 | 3/2014 | Grivna | |
| 2002/0081839 A1* | 6/2002 | Shimooka | H01L 23/5226 438/643 |
| 2004/0208214 A1* | 10/2004 | Kawasaki | B82Y 20/00 372/43.01 |
| 2005/0029614 A1* | 2/2005 | Wu | H01L 29/66143 257/471 |
| 2007/0212862 A1 | 9/2007 | Carta et al. | |
| 2007/0290234 A1* | 12/2007 | Wu | H01L 29/66143 257/212 |
| 2008/0197439 A1* | 8/2008 | Goerlach | H01L 29/8611 257/476 |
| 2009/0114948 A1* | 5/2009 | Ishida | H01L 29/872 257/183 |
| 2010/0207205 A1* | 8/2010 | Grebs | H01L 23/544 257/334 |
| 2011/0135942 A1* | 6/2011 | Yamakoshi | C22C 19/03 428/446 |
| 2011/0159675 A1* | 6/2011 | Carta | H01L 29/47 438/581 |
| 2012/0139015 A1* | 6/2012 | Yu | H01L 21/28518 257/288 |
| 2012/0181697 A1* | 7/2012 | Lavoie | H01L 21/28518 257/769 |
| 2013/0065392 A1* | 3/2013 | Gregoire | H01L 21/28518 438/664 |
| 2013/0122695 A1* | 5/2013 | Chao | H01L 29/404 438/532 |
| 2013/0234335 A1* | 9/2013 | Fitz | H01L 21/02068 257/768 |
| 2013/0240952 A1* | 9/2013 | Wong | H01L 29/66462 257/194 |
| 2014/0001489 A1* | 1/2014 | Yen | H01L 29/872 257/77 |
| 2014/0017888 A1* | 1/2014 | Hsu | H01L 29/665 438/664 |
| 2014/0073130 A1* | 3/2014 | Hilscher | H01L 21/28052 438/655 |
| 2014/0206190 A1* | 7/2014 | Li | H01L 29/401 438/683 |
| 2014/0248761 A1* | 9/2014 | Park | H01L 21/82387 438/586 |
| 2014/0306291 A1* | 10/2014 | Alptekin | H01L 29/41725 257/369 |
| 2014/0346608 A1* | 11/2014 | Kim | H01L 21/28518 257/369 |
| 2015/0084108 A1* | 3/2015 | Saha | H01L 21/82380 257/314 |

OTHER PUBLICATIONS

Schottky barrier ; http://en.wikipedia.org/wiki/Schottky_barrier ; 4 pages.
Rectifier ; From Wikipedia, the free encyclopedia ; 1 page.
J. Foggiato (WaferMasters, Inc.) ; Optimizing the Formation of Nickel Silicide ; EMRS 2004,Material Science Issues in Advanced CMOS Source-drain Engineering; Dec. 15, 2004.
W.L. Tan (University of Singapore) ; Effect of a Titanium Cap in Reducing Interfacial Oxides in the Formation of Nickel Silicide ; Journal of Applied Physics ; J. Appl. Phys. 91,2901 (2002).

* cited by examiner

SEMICONDUCTOR DEVICE AND MANUFACTURING METHOD THEREOF

CROSS-REFERENCE TO RELATED APPLICATIONS

This application claims the benefit of U.S. Provisional Application No. 61/945,771, filed Feb. 27, 2014.

Select examples of variations within the scope of the invention will become more fully understood from the detailed description and the accompanying drawings, wherein.

The following description of the variations is merely illustrative in nature and is in no way intended to limit the scope of the invention, its application, or uses.

Figure 1:
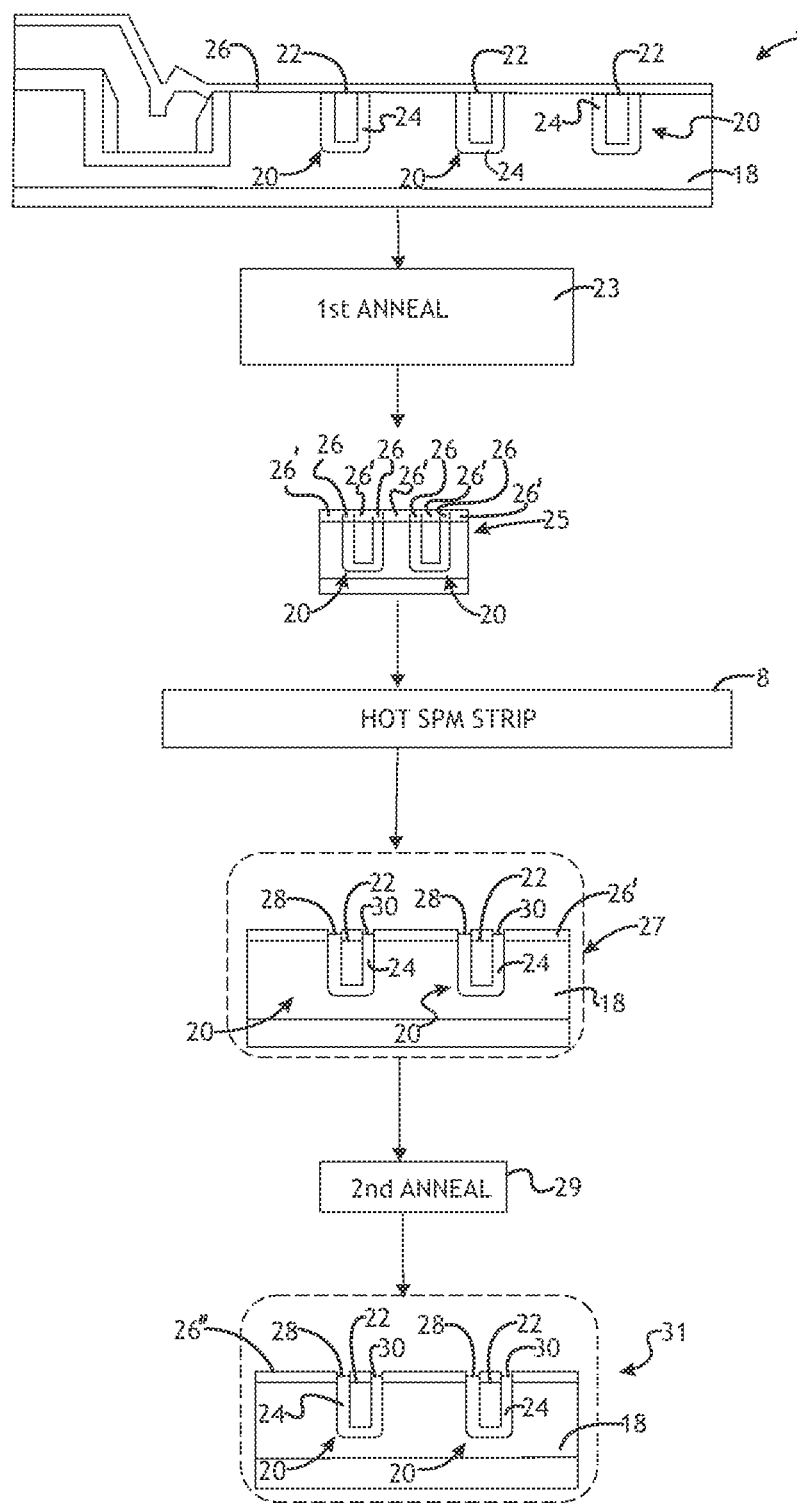
FIG. 1 is a schematic illustration of a method including a first annealing act, a stripping act, and a second annealing act, according to a number of variations.

FIG. 1 illustrates a number of variations, which may include a method which may include providing a semiconductor device 16 including a epi layer 18 having a plurality of trench devices 20 formed therein. The trench devices 20 may include a conductive material 22, such as a n-type or p-type material, which may be isolated by an isolation layer 24 along a first wall, an opposite second wall, and a bottom wall. The method may include depositing a first layer 26 on the first semiconductor device 16 and in an overlying position with respect to the trench device 20 formed in the semiconductor epi layer 18, including the isolation layer 24 and the conductive material 22. The first layer 26 may include a first metal and a second metal. In a number of variations, the first metal may be nickel and the second metal may be platinum. In a number of other variations, for example the first metal may be NiCr or Titanium, and the second metal may be Chrome or Platinum, but not limited to any particular combination. The alloy combinations for the bottom layer and top layer are not limited to any particular ratio. The weight ratio of the first metal to the second metal may range from 1:99 to 99:1 of any range there between, including but not limited to 5:95 to 95:5, and 85:15 to 60:40. In a number of variations, the thickness of the first layer 26 may range from 100 A to 1500 A, or approximately 700 A. The method may also include subjecting the first epi layer 18 to at least a first annealing act 23 to provide a first structure 25. In a number of variations the first anneal may be carried out at a temperature ranging from 200° C.-600° C. The first structure 25 may include a modified first layer 26' wherein at least a portion thereof includes a silicide including the first metal and the second metal. Thereafter, at least a portion of the first structure 25 may be subjected to stripping act 8 to remove any of the first layer 26 not reacted with silicon to form a silicide during the first annealing act 23. After the stripping act 8, a second structure 27 results including an opening 28 over a first side wall of the insulation layer 24 and an opening 30 over the second side wall of the insulation layer 24.

Thereafter, the second structure 27 may be subjected to a second annealing act 29. In a number of variations, the second annealing act 29 may be carried out a temperature ranging from 400° C.-700° C. In a number of variations the second annealing act 29 may be carried out to achieve a third structure 31 including NiPt monolayer having a predetermined barrier height. That is, the temperature and the length of time of the second anneal 29 may be carried out on different semiconductor waivers to achieve structures with varying barrier heights.

In a number of variations, such a method may be utilized to obtain a full range of metallurgical silicide barrier heights (BH) for a given first metal layer alloy composition, such as for example, but not limited to, in NiPt in trench-based Schottky rectifiers. The barrier height can be a key parameter that is used to tune the efficiency of a rectifying diode needed for low leakage (for example automotive) and may be in power applications. In a number of variations, a higher barrier height may be suitable for applications including, but not limited to, automotive applications to reduce the chance of a thermal runaway during reverse bias, by reducing the leakage current which reduces the temperature rise of a Schottky rectifiers. There can be tradeoff between low VF and low current leakage, as the barrier height increases the leakage current decreases and the forward voltage drop also increases. According to a number of variations, the barrier height may be adjusted using a single alloy composition to meet various market needs for a given family of trench rectifiers.

Barrier height of silicides including two metals can be modulated by annealing conditions. The annealing acts may include furnace or rapid temperature process anneals done in ambient conditions with inert gases. In order to reach higher barrier height spectrums for a given alloy composition, the energy needed (time and temperature) to achieve these conditions can be unfavorable for trench-based Schottky rectifiers. The silicides in these rectifiers can be separated by relatively small distances with nonreactive material (such a silicon dioxide) and with high energy anneals the silicon from the wafer epi layer can migrate creating a NiPtSi or NiSi bridge between adjacent silicides. This can cause device function issues, such as increased diode leakage. In order to manufacture NiPt silicides and not cause catastrophic silicon migration, the first annealing act may be held at a relatively low energy, for example, less than 425° C. This produces a nickel rich silicide Ni2Si with relatively low barrier height for a given alloy spectrum. To achieve higher barrier heights and not cause device failure, the silicides can receive a relatively low first anneal (for example less than 425° C.) followed by a silicide wet strip (SC 1 base) that can remove the un-reacted NiPt film and regents not in contact with the silicon substrate or epi layer. In a number of variation, a second anneal can then be applied at higher energy levels converting the nickel rich film (Ni2Si) to a more monosilicide (NiSi). As more energy is applied to the second anneal the higher barrier height within the NiPt alloy spectrum is made available. In a number of variations, NiPt is not over non-silicon regions during the second annealing act so that no silicon migration from the silicon substrate or epi layer over these regions is possible, thus allowing the silicide phase to be manipulated to produce the entire barrier height spectrum for a given NiPt alloy ratio.

In a number of variations, multiple barrier heights can be achieved with one given alloy source, which allows the designers to fine tune the barrier height for any given rectifier or rectifiers in a family. In a number of variations, the same deposition chamber may be utilized to manufacture rectifiers with different barrier heights.

A number of variations multiple barrier heights may be achieve using a method wherein the depositing a first layer on a semiconductor epi layer comprises placing the first semiconductor epi layer in a first deposition chamber and sputtering a first target having a first weight percent ratio of the first metal and second metal, and wherein the first annealing act exposes the first semiconductor epi layer to a first temperature range for a first time period range so that the first structure has a first barrier height, and further comprising: depositing a second layer on a second semiconductor epi layer in an overlying position with respect to at least one trench device formed in the second semiconductor epi layer, wherein the depositing a second layer on a second semiconductor epi layer comprising placing the second semiconductor epi layer in the first deposition chamber and sputtering the first target having the first weight percent ratio of the first metal and second metal, and wherein the second layer comprises the first metal and the second metal; subjecting the second semiconductor epi layer to at least a second annealing act to provide a second structure, and wherein the second annealing act exposes the second semiconductor epi layer to a second temperature range for a second time period range so that the second structure has a second barrier height different than the first barrier height; stripping at least a portion of the second structure to remove to remove any of the second layer not reacted with silicon to form a silicide during the second annealing act.

In a number of variations, a large window of annealing conditions for a given NiPt alloy composition and trench-base Schottky rectifiers may be utilized to produce a stable Schottky device with uniform parameters. The key parameters may include reverse bias leakage, reverse bias breakdown, stable barrier heights. The barrier height can also be a key parameter that is used to tune the efficiency of the rectifying diode needed for low leakage applications, such as automotive applications and medium power applications.

Figure 2:
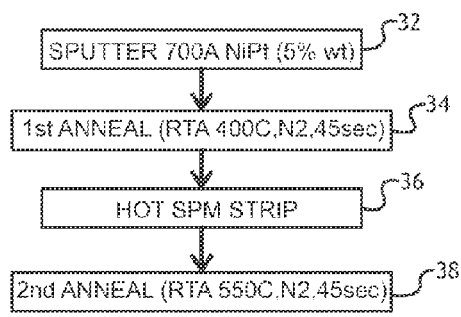
FIG. 2 is a schematic illustration of a method including a sputtering act, a first annealing act, a stripping act, and a second annealing act, according to a number of variations.

FIG. 2 illustrates a number of variations, which may include a method which may include sputtering a target, which may include 95 weight percent nickel and 5 weight percent platinum, onto a semiconductor device having a plurality of trench devices formed therein, as illustrated by box 32. The method may include subjecting the semiconductor device to a first annealing act, which may be a rapid temperature annealing act carried out at 400° C., in a nitrogen atmosphere for approximately 45 seconds, as illustrated by box 34. Thereafter, the method may include stripping any nickel and platinum not reacted with silicon using a hot SPM strip, which may include a mixture of sulfuric acid and hydrogen peroxide, as illustrated by box 36. However, the method is not limited to using a hot SPM strip. The salicide strip may be an aqua regia mixture or any chemistry that removes unreacted metal alloy. Thereafter, the stripped structure may be subjected to a second annealing act, which may be a rapid thermal anneal at approximately 550° C., in a nitrogen atmosphere for approximately 45 second, as illustrated in box 38.

Figure 3:
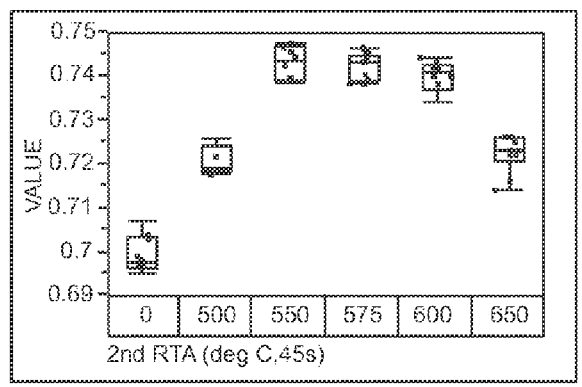
FIG. 3 is a comparative graph showing the variation in barrier height of a device made without using a second annealing act compared to devices made using methods including a second annealing act at different temperatures to achieve different barrier heights (eV), according to a number of variations.

FIG. 3 is a comparative graph showing the variation in barrier height of a device made without using a second annealing act compared to devices made using methods including a second annealing act at different temperatures to achieve different barrier heights (eV), according to a number of variations.

Figure 4:
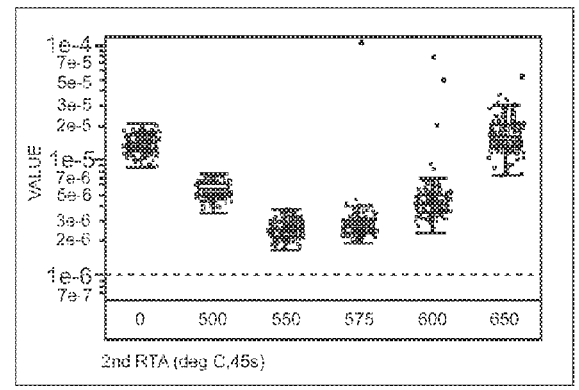
FIG. 4 is a comparative graph of the current leakage (A) from a trench Schottky device made without a second annealing act compared to devices made by methods having a second annealing act at various different temperatures, according to a number of variations.

FIG. 4 is a comparative graph of the current leakage (V) from a trench Schottky device made without a second annealing act compared to devices made by methods having a second annealing act at various different temperatures, according to a number of variations.

Figure 5:
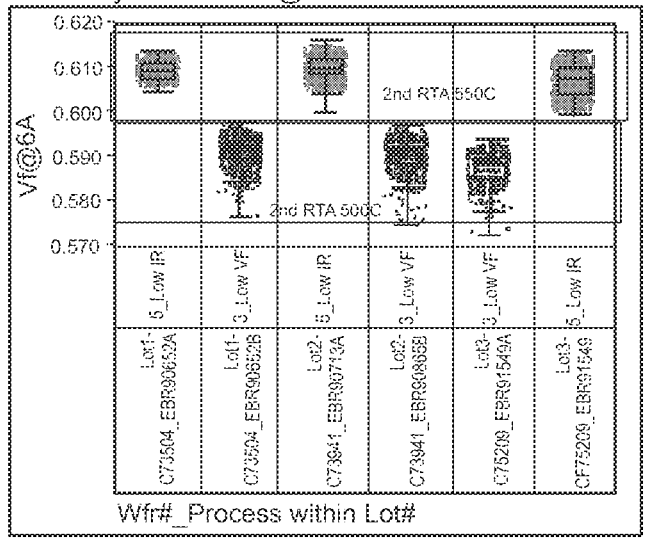
FIG. 5 is a graph illustrating different forward voltage (V) properties of 120V trench Schottky devices manufactured using different temperatures of a second annealing act, according to a number of variations.

FIG. 5 is a graph illustrating different forward voltage (V) properties of 120V trench Schottky devices manufactured using different temperatures of a second annealing act, according to a number of variations.

Figure 6:
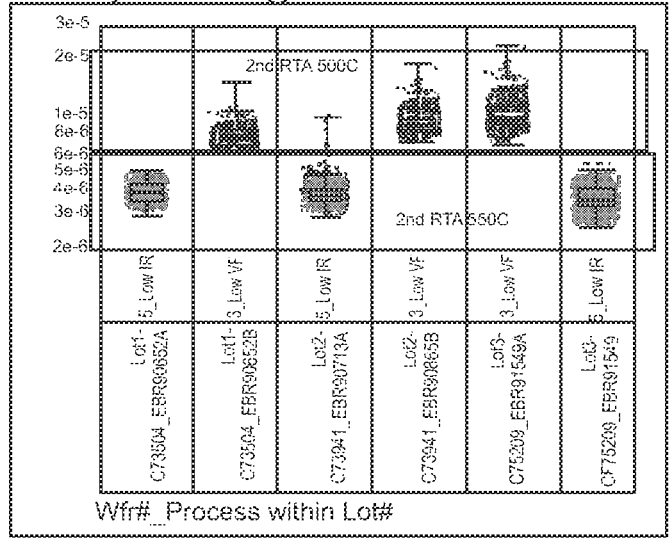
FIG. 6 is a graph of data of leakage (A) for 120V trench rectifiers produced using different temperatures for a second annealing act, according to a number of variations.

FIG. 6 is a graph of data of leakage (A) for 120V trench rectifiers produced using different temperatures for a second annealing act, according to a number of variations.

Figure 7:
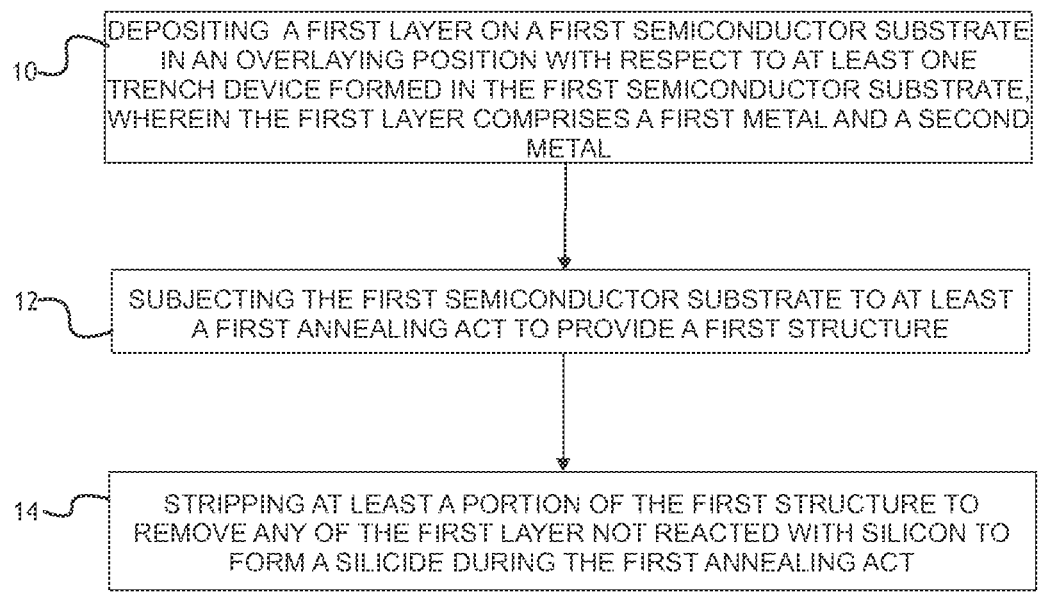
FIG. 7 is a schematic illustration of a method according to a number of variations.

More generically, FIG. 7 illustrates a number of variations, which may include an act 10 of depositing a first layer on a first semiconductor epi layer in an overlying position with respect to at least one trench device formed in the first semiconductor epi layer, wherein the first layer comprises a first metal and a second metal, as illustrated by box 10; subjecting a first semiconductor epi layer to at least a first annealing act to provide a first structure, as illustrated by box 12; and stripping at least a portion of the first structure to remove any of the first layer not reacted with silicon to form a silicide during the first annealing act, as illustrated by box 14.

The following description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may include a method that may include depositing a first layer on a first semiconductor epi layer in an overlying position with respect to at least one trench structure formed in the first semiconductor epi layer. The layer may include a first metal and a second metal. The first semiconductor epi layer may be subjected to at least a first annealing act to provide a first structure. At least a portion of the first structure may be stripped to remove any of the first layer not reacted with silicon to form a silicide during the first annealing act. Thereafter, the stripped first structure may be subjected to a second annealing act.

Variation 2 may include a method as set forth in Variation 1 wherein the first metal comprises nickel and wherein the second metal comprises platinum.

Variation 3 may include a method as set forth in Variation 2 wherein the nickel is 95 weight percent of the first layer and the platinum is 5 weight percent of the first layer.

Variation 4 may include a method as set forth in Variation 2 wherein the nickel is 85 weight percent of the first layer and the platinum is 15 weight percent of the first layer.

Variation 5 may include a method as set forth in Variation 2 wherein the nickel is 60 weight percent of the first layer and the platinum is 40 weight percent of the first layer.

Variation 6 may include a method as set forth in any of Variations 1-5 wherein the depositing a first layer on a semiconductor epi layer comprising placing the first semiconductor epi layer in a first deposition chamber and sputtering a first target having a first weight percent ratio of the first metal and second metal, and wherein the first annealing act exposes the first semiconductor epi layer to a first temperature range for a first time period range so that the first structure has a first barrier height, and further comprising: depositing a second layer on a second semiconductor epi layer in an overlying position with respect to at least one trench device formed in the second semiconductor epi layer, wherein the depositing a second layer on a second semiconductor epi layer comprising placing the second semiconductor epi layer in the first deposition chamber and sputtering the first target having the first weight percent ratio of the first metal and second metal, and wherein the second layer comprises the first metal and the second metal; subjecting the second semiconductor epi layer to at least a second annealing act to provide a second structure, and wherein the second annealing act exposes the second semiconductor epi layer to a second temperature range for a second time period range so that the second structure has a second barrier height different than the first barrier height; stripping at least a portion of the second structure to remove to remove any of the second layer not reacted with silicon to form a silicide during the second annealing act.

Variation 7 may include a method as set forth in Variation 6 wherein the first temperature range is different that the second temperature range.

Variation 8 may include a method as set forth in any of Variations 6-7 wherein the first time period range is different than the second time period range.

Variation 9 may include a method as set forth in any of Variations 6-8 wherein the first structure and second structure are constructed and arranged for a 10-600V device but wherein the first structure and the second structure are for devices having different voltage ratings.

Variation 1-10 may include a method as set forth in any of Variations 1-9 wherein the first annealing act comprises exposing the first epi layer to a temperature ranging from 200° C.-600° C.

Variation 11 may include a method as set forth in any of Variations 1-10 wherein the subjecting the stripped first structure to a second annealing act comprises exposing the first epi layer to a temperature ranging from 400° C.-700° C.

Variation 12 may include a method as set forth in any of Variations 10-11 wherein at least one of the first annealing act or the second annealing act is a rapid temperature annealing act.

Variation 13 may include a method as set forth in any of Variations 10-12 wherein the first annealing act is a rapid temperature annealing act exposing the first semiconductor epi layer to a temperature of approximately 400° C. for approximately 45 seconds, and the second annealing act is a rapid temperature annealing act exposing the striped and annealed first structure to a temperature of approximately 550° C. for 45 seconds.

Variation 14 may include a method as set forth in any of Variations 1-13 wherein the first annealing act is a rapid temperature annealing act carried out in a nitrogen atmosphere furnace for approximately 45 seconds.

Variation 15 may include a method as set forth in any of Variations 1-13 wherein the first annealing act is carried out in a furnace and exposes the first semiconductor epi layer to a temperature ranging from 300° C.-500° C.

Variation 16 may include a method as set forth in any of Variations 1-15 wherein the first annealing act is carried out in a nitrogen atmosphere furnace for approximately 30 minutes.

Variation 17 may include a method as set forth in any of Variations 1-16 wherein the stripping comprises exposing at least a portion of the first structure to a hot sulfuric acid (H2SO4) and hydrogen peroxide (H2O2) mixture.

Variation 18 may include a method as set forth in any of Variations 1-17 wherein the stripping comprises exposing at least a portion of the first structure to an aqua regia mixture.

Variation 19 may include a method as set forth in any of Variations 1-18 wherein the first metal and the second metal are present in a weight ratio ranging from 5:95 to 95:5.

Variation 20 may include a method as set forth in any of Variations 1-19 wherein the first metal and the second metal are present in a weight ratio ranging from 85:15 to 60:40.

The above description of select variations within the scope of the invention is merely illustrative in nature and, thus, variations or variants thereof are not to be regarded as a departure from the spirit and scope of the invention.

What is claimed is:

1. A method comprising:
   depositing a first layer on a first semiconductor epi layer in an overlying position with respect to at least one trench structure formed in the first semiconductor epi layer, wherein the first layer comprises a first metal and a second metal, and wherein the trench structure comprises an isolating layer along a first wall, a bottom surface, and an opposite second wall, and a conductive layer formed in the trench between the first wall and the second wall, wherein the first layer overlies the conductive layer and the isolating layer;
   subjecting the first semiconductor epi layer to at least a first annealing act to provide a first structure wherein the first layer reacts with the first semiconductor epi layer and the conductive layer to form a silicide;
   stripping at least a portion of the first structure to remove any of the first layer not reacted with silicon to form a silicide during the first annealing act, wherein an opening is thereby formed to the isolating layer at the first and second wall of the trench structure and between the silicide formed overlying the first semiconductor epi layer and silicide formed overlying the conductive layer; and
   thereafter, subjecting the stripped first structure to a second annealing act.

2. A method as set forth in claim 1 wherein the first metal comprises nickel and wherein the second metal comprises platinum.

3. A method as set forth in claim 2 wherein the nickel is 95 weight percent of the first layer and the platinum is 5 weight percent of the first layer.

4. A method as set forth in claim 2 wherein the nickel is 85 weight percent of the first layer and the platinum is 15 weight percent of the first layer.

5. A method as set forth in claim 2 wherein the nickel is 60 weight percent of the first layer and the platinum is 40 weight percent of the first layer.

6. A method comprising:
   depositing a first layer on a first semiconductor epi layer in an overlying position with respect to at least one trench structure formed in the first semiconductor epi layer, wherein the first layer comprises a first metal and a second metal and wherein the trench structure comprises an insulation layer along a first wall, an opposite second wall, and a bottom wall and a conductive layer formed in the trench overlying the insulation layer between the first wall and the second wall and over the bottom wall, wherein the first layer overlies the conductive layer and a top surface of the isolating layer at the first and second wall of the trench structure;

subjecting the first semiconductor epi layer to at least a first annealing act to provide a first structure wherein the energy of the first annealing act is selected to be low enough to prevent silicon from migrating across the first or second wall of the insulation layer of the trench structure to form a silicide overlying the insulation layer, and wherein the first annealing act causes the first layer to react with the first semiconductor epi layer and the conductive layer to form a silicide;

stripping at least a portion of the first structure to remove any of the first layer overlying the first and second wall of the insulation layer not reacted with silicon to form a silicide during the first annealing act, forming an opening to the insulation layer at the first and second wall of the trench structure; and thereafter, subjecting the stripped first structure to a second annealing act.

7. A method as set forth in claim 6 wherein the first temperature range is different that the second temperature range.

8. A method as set forth in claim 6 wherein the first time period range is different than the second time period range.

9. A method as set forth in claim 6 wherein the time and temperature of the second annealing act is adjusted to manufacture devices having different voltage ratings.

10. A method as set forth in claim 1 wherein the first annealing act comprises exposing the first epi layer to a temperature ranging from 200° C.-600° C.

11. A method as set forth in claim 10 wherein subjecting the stripped first structure to a second annealing act comprises exposing the first epi layer to a temperature ranging from 400° C.-700° C.

12. A method as set forth in claim 11 wherein the first semiconductor epi layer and the conductive layer are comprised of silicon.

13. A method as set forth in claim 11 wherein the first annealing act is a rapid temperature annealing act exposing the first semiconductor epi layer to a temperature of approximately 400° C. for approximately 45 seconds, and the second annealing act is a rapid temperature annealing act exposing the striped and annealed first structure to a temperature of approximately 550° C. for 45 seconds.

14. A method as set forth in claim 13 wherein the first annealing act is a rapid temperature annealing act carried out in a nitrogen atmosphere furnace for approximately 45 seconds.

15. A method as set forth in claim 13 wherein the first annealing act is carried out in a furnace and exposes the first semiconductor epi layer to a temperature ranging from 300° C.-500° C.

16. A method as set forth in claim 15 wherein the first annealing act is carried out in a nitrogen atmosphere furnace for approximately 30 minutes.

17. A method as set forth in claim 1 wherein the stripping comprises exposing at least a portion of the first structure to a hot sulfuric acid ($H_2SO_4$) and hydrogen peroxide ($H_2O_2$) mixture.

18. A method as set forth in claim 1 wherein the stripping comprises exposing at least a portion of the first structure to an aqua regia mixture.

19. A method as set forth in claim 1 wherein the first metal and the second metal are present in a weight ratio ranging from 85:15 to 60:40.

20. A method comprising:

depositing a first layer on a top surface of a first semiconductor layer in an overlying position with respect to at least one trench structure formed in the first semiconductor layer, wherein the first layer comprises a first metal and a second metal and wherein the trench structure is filled with a conductive layer isolated from the first semiconductor layer by an isolating layer extending from the top surface along a first vertical wall, a bottom surface, and an opposite second vertical wall of the trench structure, and wherein the first layer is in an overlying position with respect to the conductive layer and the isolating layer;

subjecting the first semiconductor layer to at least a first annealing act to provide a first structure held at a first energy level and to form a silicide layer overlying the first semiconductor layer and the conductive layer;

stripping at least a portion of the first structure to remove any of the first layer not reacted with silicon to form a silicide during the first annealing act to form an opening between the silicide layer overlying the first semiconductor layer and silicide layer overlying the conductive layer; and thereafter, subjecting the stripped first structure to a second annealing act held at a second energy level that is higher than the first energy level.

* * * * *